(12) United States Patent
Wang et al.

(10) Patent No.: US 7,993,750 B2
(45) Date of Patent: Aug. 9, 2011

(54) THERMAL INTERFACE MATERIAL AND METHOD FOR FABRICATING THE SAME

(75) Inventors: Ding Wang, Beijing (CN); Chang-Hong Liu, Beijing (CN); Peng-Cheng Song, Beijing (CN); Shou-Shan Fan, Beijing (CN)

(73) Assignees: Tsinghua University, Beijing (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 451 days.

(21) Appl. No.: 11/959,144

(22) Filed: Dec. 18, 2007

(65) Prior Publication Data

US 2008/0241545 A1 Oct. 2, 2008

(30) Foreign Application Priority Data

Mar. 30, 2007 (CN) .......................... 2007 1 0073770

(51) Int. Cl.
*B32B 9/00* (2006.01)
(52) U.S. Cl. ..................................................... 428/408
(58) Field of Classification Search .................. 428/408; 423/447.1, 445 R; 977/744; 165/185
See application file for complete search history.

(56) References Cited

U.S. PATENT DOCUMENTS

| 6,142,887 | A | 11/2000 | Sullivan et al. | |
|---|---|---|---|---|
| 7,396,477 | B2 | 7/2008 | Hsiao | |
| 2004/0265489 | A1* | 12/2004 | Dubin | 427/212 |
| 2004/0266065 | A1* | 12/2004 | Zhang et al. | 438/122 |
| 2006/0222852 | A1 | 10/2006 | Dubin et al. | |
| 2006/0255450 | A1* | 11/2006 | Pan et al. | 257/712 |
| 2006/0263524 | A1 | 11/2006 | Jiang et al. | |

FOREIGN PATENT DOCUMENTS

| CN | 1667821 A | 9/2005 |
|---|---|---|
| TW | 200702297 | 1/2007 |
| WO | 2007002902 A2 | 1/2007 |

* cited by examiner

*Primary Examiner* — David Sample
*Assistant Examiner* — Daniel H Miller
(74) *Attorney, Agent, or Firm* — Jeffrey T. Knapp

(57) ABSTRACT

A thermal interface material includes an array of carbon nanotubes with interspaces defined therebetween; and a low melting point metallic material filled in the interspaces. A method for fabricating a thermal interface material, the method includes (a) providing an array of carbon nanotubes with interspaces defined therebetween; and (b) depositing a low melting point metallic material on the carbon nanotubes in the interspaces therebetween to form a metallic layer with the array of carbon nanotubes embedded therein, and thereby, achieving the thermal interface material.

16 Claims, 3 Drawing Sheets providing an array of carbon nanotubes with interspaces defined therebetween

↓ depositing a low melting point metallic material on the carbon nanotubes in the innerspaces therebetween to form a metallic layer with the array of carbon nanotubes embedded therein, and thereby, achieving the thermal interface material

THERMAL INTERFACE MATERIAL AND METHOD FOR FABRICATING THE SAME

BACKGROUND

1. Field of the Invention

The present invention relates to a thermal interface material and a method for fabricating the same, and particularly to a carbon-nanotube-based thermal interface material and a method for fabricating the same.

2. Discussion of Related Art

Electronic components such as semiconductor chips are becoming progressively smaller, while at the same time heat dissipation requirements thereof are increasing. Commonly, a thermal interface material is utilized between the electronic component and an integrated heat spreader in order to efficiently dissipate heat generated by the electronic component. Whereas, the performance of the thermal interface material is restricted by a heat conduction coefficient thereof. The heat conduction coefficient of the thermal interface material is now considered to be too low for many contemporary applications.

Conventional thermal interface materials are metallic materials. However, the metallic materials disadvantageously tend to have a much higher coefficient of thermal expansion than semiconductor devices. Mechanical stresses are induced during temperature cycling and will tend to overstress the electronic components leading to potential failures when metallic materials are used as a thermal interface material.

A recently developed thermal interface material is a composite material obtained by diffusing particles in a polymer. The particles can be made of graphite, boron nitride, silicon oxide, alumina, silver, or specially be made of carbon nanotubes. The carbon nanotubes are distributed orderly and provide a heat conduction path in the polymer. Additionally, the carbon nanotubes can protrude from the polymer and contact the electronic components or the integrated heat spreaders. However, the heat conduction coefficient of the polymer is relatively low. As such, performance of the thermal interface material is restricted by the used polymer.

What is needed, therefore, is to provide a carbon-nanotube-based thermal interface material with high heat conduction coefficient and a method for fabricating the same, in which the above problems are eliminated or at least alleviated.

SUMMARY

In one embodiment, a thermal interface material includes an array of carbon nanotubes with interspaces defined therebetween; and a low melting point metallic material filled in the interspaces.

In another embodiment, a method for fabricating a thermal interface material, the method includes (a) providing an array of carbon nanotubes with interspaces defined therebetween; and (b) depositing a low melting point metallic material on the carbon nanotubes in the interspaces therebetween to form a metallic layer with the array of carbon nanotubes embedded therein, and thereby, achieving the thermal interface material.

Other advantages and novel features of the present thermal interface material and method for fabricating the same will become more apparent from the following detailed description of preferred embodiments when taken in conjunction with the accompanying drawings.

BRIEF DESCRIPTION OF THE DRAWINGS

Many aspects of the present invention of the thermal interface material and related method for fabricating the same can be better understood with reference to the following drawings.

Figure 1:
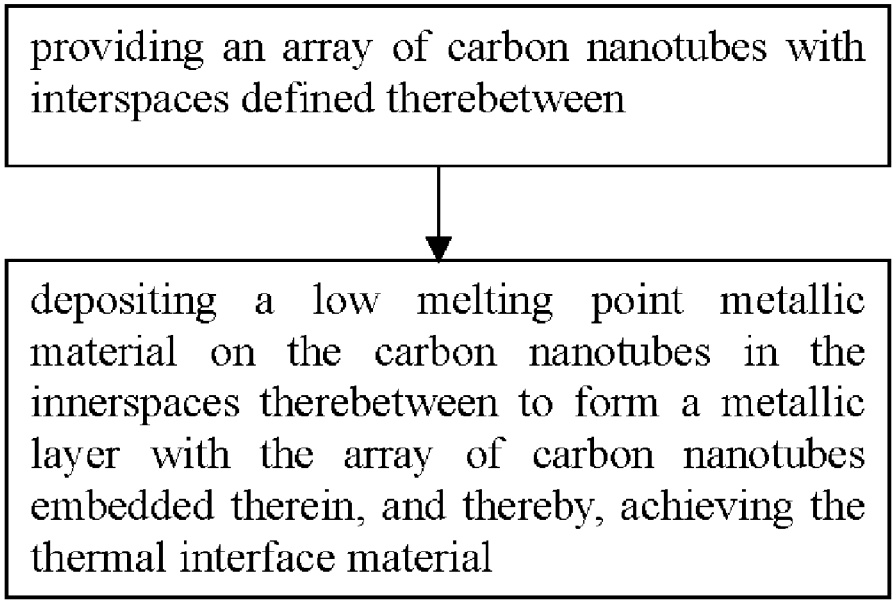
FIG. 1 is a flow chart of a method for fabricating a thermal interface material, in accordance with a present embodiment.

Corresponding reference characters indicate corresponding parts throughout the several views. The exemplifications set out herein illustrate at least one preferred embodiment of the present thermal interface material and related method for fabricating the same, in at least one form, and such exemplifications are not to be construed as limiting the scope of the invention in any manner.

DETAILED DESCRIPTION OF PREFERRED EMBODIMENTS

Reference will now be made to the drawings to describe, in detail, embodiments of the present thermal interface material and method for fabricating the same.

Referring to FIG. 1, a method for fabricating the thermal interface material includes the steps of: (a) providing an array of carbon nanotubes with interspaces defined between the carbon nanotubes, quite suitably, providing a super-aligned array of carbon nanotubes with interspaces defined between the carbon nanotubes; (b) depositing a metallic material in the interspaces between the carbon nanotubes to form a metallic layer with the array of carbon nanotubes embedded therein, and thereby, achieving the thermal interface material.

In step (a), a given super-aligned array of carbon nanotubes can be formed by the substeps of: (a1) providing a substantially flat and smooth substrate; (a2) forming a catalyst layer on the substrate; (a3) annealing the substrate with the catalyst at a temperature in the approximate range from 700° C. to 900° C. in air for about 30 to 90 minutes; (a4) heating the substrate with the catalyst at a temperature in the approximate range from 500° C. to 740° C. in a furnace with a protective gas therein; and (a5) supplying a carbon source gas into the furnace for about 5 to 30 minutes and growing a super-aligned array of the carbon nanotubes from the substrate.

In step (a1), the substrate can, beneficially, be a P-type silicon wafer, an N-type silicon wafer, or a silicon wafer with a film of silicon dioxide thereon. Quite usefully, a 4-inch P-type silicon wafer is used as the substrate.

In step (a2), the catalyst can, advantageously, be made of iron (Fe), cobalt (Co), nickel (Ni), or any alloy thereof.

In step (a4), the protective gas can, beneficially, be made up of at least one of nitrogen ($N_2$), ammonia ($NH_3$), and a noble gas. In step (a5), the carbon source gas can, advantageously, be a hydrocarbon gas, such as ethylene ($C_2H_4$), methane ($CH_4$), acetylene ($C_2H_2$), ethane ($C_2H_6$), or any combination thereof.

The super-aligned array of carbon nanotubes can, opportunely, be in a height of about 10 microns to 1 millimeter and include a plurality of carbon nanotubes parallel to each other and substantially perpendicular to the substrate. The super-aligned array of carbon nanotubes formed under the above conditions is essentially free of impurities, such as carbonaceous or residual catalyst particles. The carbon nanotubes in the super-aligned array are packed together closely by van der Waals attractive force. The array of carbon nanotubes formed on the substrate has a first surface and a second surface. The second surface of the array of carbon nanotubes contacts the substrate.

It is to be understood that, the array of carbon nanotubes can be formed by other methods know in the art.

Figure 2:
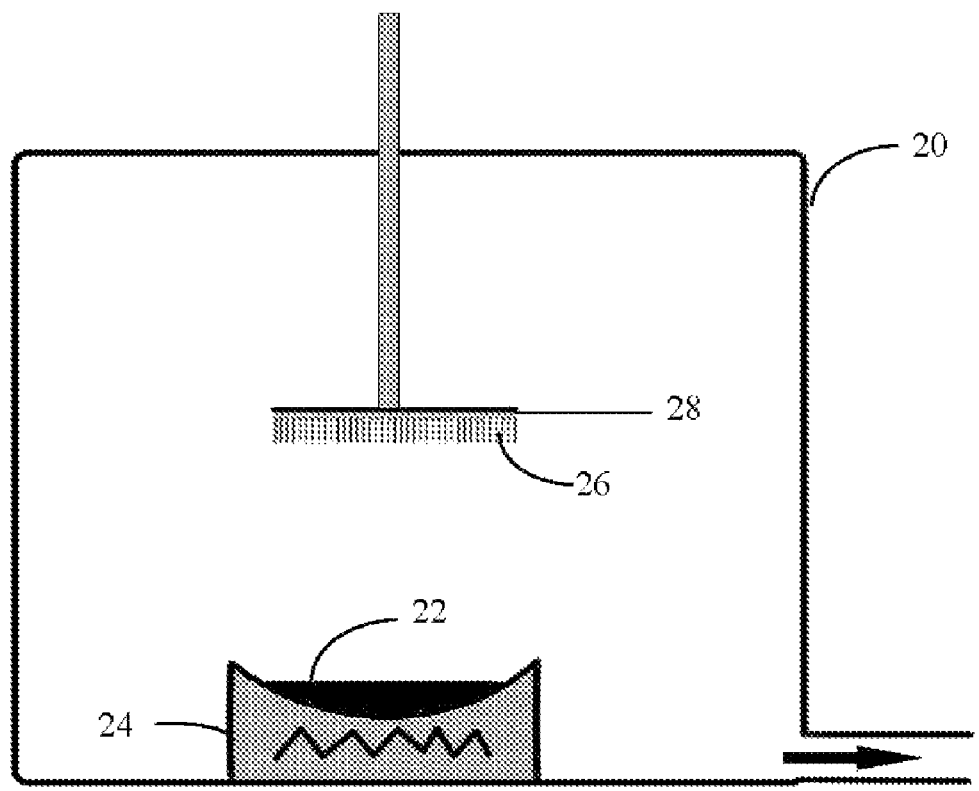
FIG. 2 is a schematic view of a device for fabricating the thermal interface material of FIG. 1.

In step (b), the metallic layer can be deposited on the carbon nanotubes by means of physical vapor deposition (PVD), chemical vapor deposition (CVD), or other methods known in the art. In the present embodiment, quite suitably, the metallic material can be deposited in the interspaces between the carbon nanotubes, and thereby, the metallic layer can be formed by a method of vacuum evaporation. Referring to FIG. 2, a device for depositing the metallic material in the interspaces between the carbon nanotubes includes a vacuum container 20, a source 22, and a heater 24. The source 22 and the heater 24 are disposed in the vacuum container 20. The heater 24 can, suitably, be disposed at a lower side in the vacuum container 20. The source 22 is disposed on the heater 24. A vacuum pump (not shown) can be further connected to the vacuum container 20 to evacuate the air therein. In use, the substrate 28 with the array of carbon nanotubes 26 formed by step (a) can, usefully, be disposed at an upper side in the vacuum container 20 and separated from the source 22. The first surface of the array of carbon nanotubes 26 faces the source 22.

The material of the source 20 is a low melting point metallic material and can, opportunely, be selected from the group consisting of indium (In), gallium (Ga), an alloy of stibium (Sb) and bismuth (Bi), an alloy of lead and tin, and any combination thereof. The melting point of the metallic material of the source 20 is below 200° C. The degree of vacuum of the vacuum container 20 is above 1 pascal (Pa).

In step (b), the source 22 can, advantageously, be evaporated or sublimated by the heater 24 to form a metallic vapor in the vacuum container 20. When it meets the array of carbon nanotubes 26, the metallic vapor condenses on the first surface of the array of carbon nanotubes 26 and infiltrates into the interspaces between the carbon nanotubes. As such, a metallic layer with the array of carbon nanotubes 26 embedded therein is formed on the substrate 28.

After step (b), the metallic layer with the array of carbon nanotubes 26 embedded therein can be peeled from the substrate 28. And, as in step (b), the metallic material can be further deposited on the second surface of the array of carbon nanotubes 26 and infiltrated into the interspaces between the carbon nanotubes.

Figure 3:
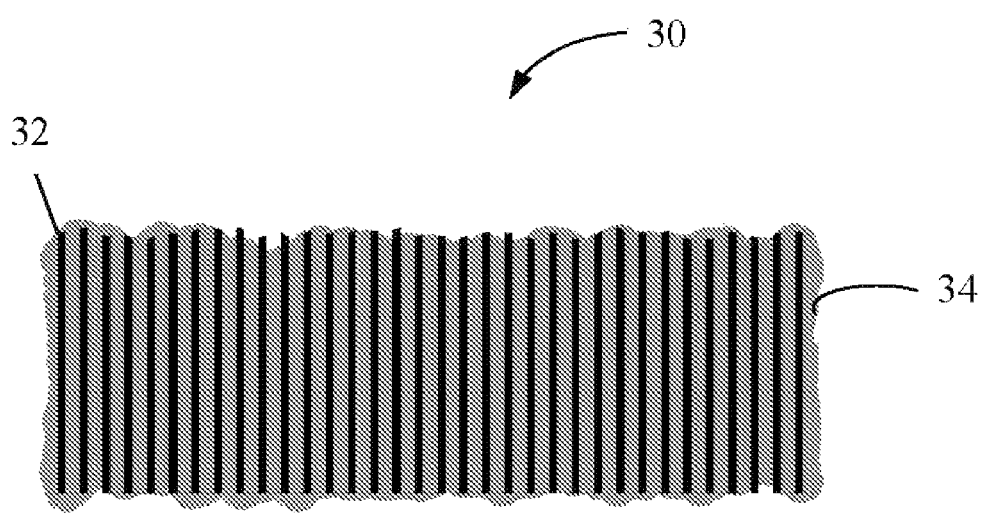
FIG. 3 is a schematic view of the thermal interface material of FIG. 1.

Referring to FIG. 3, a thermal interface material 30, formed by the method described above, is shown. Low melting point metallic material 34 is filled into the array of carbon nanotubes 32. In the present embodiment, the thickness of the thermal interface material 30 is in the approximate range from 10 microns to 1 millimeter.

In use, the thermal interface material 30 of the present embodiment can be disposed between an electronic component and a heat spreader. When temperature is elevated above the melting point, the low melting point metallic material 34 changes to a liquid. The liquid metallic material is capable of filling the gaps between the electronic component and the heat spreader, and as such, reduces the thermal contact resistance therebetween. Further, due to a high thermal conductivity of the metallic material, the thermal interface material has a higher thermal conductivity than a polymer-carbon nanotube composite. Additionally, during temperature cycling, mechanical stress of the metallic material can be reduced by the carbon nanotubes dispersed therein. Further, the method for fabricating the thermal interface material of the present embodiment is simple and can be applied in mass production at a low cost.

Finally, it is to be understood that the above-described embodiments are intended to illustrate rather than limit the invention. Variations may be made to the embodiments without departing from the spirit of the invention as claimed. The above-described embodiments illustrate the scope of the invention but do not restrict the scope of the invention.

What is claimed is:

1. A thermal interface material, comprising:
   a continuous array of carbon nanotubes comprising carbon nanotubes and interspaces defined between the carbon nanotubes; and
   a low melting point metallic material is located in the interspaces;
   wherein the low melting point metallic material is gallium.

2. The thermal interface material as claimed in claim 1, wherein a thickness of the thermal interface material is in the approximate range from 10 microns to 1 millimeter.

3. The thermal interface material as claimed in claim 1, wherein the carbon nanotubes are substantially parallel to each other.

4. The thermal interface material as claimed in claim 1, wherein the carbon nanotubes are held together by van der Waals attractive force.

5. A method for fabricating a thermal interface material, the method comprising:
   (a) providing a continuous array of carbon nanotubes comprising carbon nanotubes and interspaces defined between the carbon nanotubes, the array of carbon nanotubes, having a first surface and a second surface, is formed on the substrate, and the second surface of the array of carbon nanotubes is in contact with the substrate;
   (b) depositing a low melting point metallic material on the carbon nanotubes in the interspaces therebetween to form a metallic layer with the array of carbon nanotubes embedded therein;
   (c) peeling the metallic layer with the array of carbon nanotubes embedded therein from the substrate; and
   (d) depositing the low melting point metallic material on the second surface of the array of carbon nanotubes and infiltrated into the interspaces between the carbon nanotubes,
   wherein the low melting point metallic material is gallium.

6. The method as claimed in claim 5, wherein the low melting point metallic material is deposited in the interspaces between the carbon nanotubes by means of physical vapor deposition, or chemical vapor deposition.

7. The method as claimed in claim 6, wherein the metallic material is deposited using a vacuum evaporation process.

8. The method as claimed in claim 7, wherein in the vacuum evaporation process, a degree of vacuum is above 1 pascal.

9. The method as claimed in claim 5, wherein step (a) further comprises the substeps of:
   (a1) providing a substantially flat and smooth substrate;
   (a2) forming a continuous catalyst layer on the substrate;
   (a3) annealing the substrate with the catalyst layer at the approximate range of 700° C. to 900° C. for about 30 to 90 minutes in air atmosphere;
   (a4) heating the substrate with the catalyst layer up to about 500° C. to 740° C. in a furnace in protective gas; and
   (a5) supplying a carbon source gas into the furnace for about 5 to 30 minutes and growing the array of the carbon nanotubes in a height of about 10 microns to 1 millimeter.

10. The method as claimed in claim 5, wherein in step (a), the continuous array of carbon nanotubes is grown from a continuous catalyst layer on a substrate.

11. A thermal interface material comprising:

a matrix comprised of a low melting point metallic material, the matrix having a thermally conductive first face and an opposite thermally conductive second face; and a continuous array of carbon nanotubes comprising carbon nanotubes, the carbon nanotubes being substantially parallel to each other, extending from the first to the second faces, and having a substantially entire length embedded in the matrix, wherein the low melting point metallic material is gallium.

12. The thermal interface material as recited in claim 11, wherein the first face is substantially parallel to the second face.

13. The thermal interface material as recited in claim 12, wherein each of the carbon nanotubes is substantially perpendicular to the first and second faces.

14. The thermal interface material as recited in claim 11, wherein the continuous array of carbon nanotubes comprises interspaces defined between the carbon nanotubes, and the low melting point metallic material is filled in the interspaces.

15. The thermal interface material as claimed in claim 11, wherein the carbon nanotubes are held together by van der Waals attractive force.

16. The thermal interface material as claimed in claim 11, wherein the low melting point metallic material comprises a material that is selected from the group consisting of gallium, an alloy of lead and tin, and any combination thereof.

* * * * *